US011108390B2

United States Patent
Roig-Guitart et al.

(10) Patent No.: US 11,108,390 B2
(45) Date of Patent: Aug. 31, 2021

(54) METHOD OF FORMING A SEMICONDUCTOR DEVICE AND CIRCUIT THEREFOR

(71) Applicant: SEMICONDUCTOR COMPONENTS INDUSTRIES, LLC, Phoenix, AZ (US)

(72) Inventors: Jaume Roig-Guitart, Oudenaarde (BE); Johan Camiel Julia Janssens, Asse (BE); Frederick Johan G Declercq, Harelbeke (BE); Teddy Bonnin, Kluisbergen (BE)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 16/735,180

(22) Filed: Jan. 6, 2020

(65) Prior Publication Data
US 2021/0211126 A1 Jul. 8, 2021

(51) Int. Cl.
*H03K 17/687* (2006.01)
*H02M 1/08* (2006.01)

(52) U.S. Cl.
CPC .......... *H03K 17/6871* (2013.01); *H02M 1/08* (2013.01)

(58) Field of Classification Search
CPC ............. H03K 17/687; H03K 17/6871; H03K 17/6872; H02M 1/08; H02M 1/081; H02M 1/082; H02M 1/083; H02M 1/084; H02M 1/0845; H02M 1/88; H02M 1/092; H02M 1/096

USPC .................................................. 327/108–112
See application file for complete search history.

(56) References Cited

U.S. PATENT DOCUMENTS

| | | | |
|---|---|---|---|
| 2019/0172683 A1* | 6/2019 | Mavretic | H01L 29/2003 |
| 2020/0295743 A1* | 9/2020 | Guillot | H03K 17/223 |

OTHER PUBLICATIONS

Aaron Cai et al., "2-phase 2-stage Capacitor-less Gate Driver for Gallium Nitride Gate Injection Transistor for Reduced Gate Ringing," IEEE 978-1-4673-7885, Jul. 2015, pp. 129-134.
Harry C. P. Dymond et al., "Reduction of oscillations in a GaN bridge leg using active gate driving with sub-ns resolution, arbitrary gate-resistance patterns," 2016 IEEE Energy Conversion Congress and Exposition (ECCE), Sep. 2016, 6 pages.
GaN Systems, GN010 Application Note, EZDrive Solution for GaN Systems E-HEMT, Dec. 21, 2018, 15 pages.
Panasonic, "GaN-Tr Application Note (PGA26E07BA)," Revision 2.4, Jun. 14, 2017, 46 pages.
Tong Sun et al., "Three-Level Driving Method for GaN Transistor with Improved Efficiency and Reliability within Whole Load Range," IEEE 978-1-4799-2325, Jan. 2014, pp. 2569-2573.
Yue Wen et al., "A Dual-Mode Driver IC With Monolithic Negative Drive-Voltage Capability and Digital Current-Mode Controller for Depletion-Mode GaN HEMT," IEEE Transactions on Power Electronics, vol. 32, No. 1, Jan. 2017, pp. 423-432.

* cited by examiner

*Primary Examiner* — Diana J. Cheng
(74) *Attorney, Agent, or Firm* — Robert F. Hightower

(57) ABSTRACT

In one embodiment, a driver circuit is configured to form a Vgs of a transistor as a negative value during a time interval that a second transistor, connected to the first transistor, is being enabled.

20 Claims, 6 Drawing Sheets

METHOD OF FORMING A SEMICONDUCTOR DEVICE AND CIRCUIT THEREFOR

BACKGROUND

The present invention relates, in general, to electronics, and more particularly, to semiconductors, structures thereof, and methods of forming semiconductor devices.

In the past, various methods and structures were used to control power transistors that were used in various applications such as for example, switching power supply controllers or other kinds of applications. Some applications utilized gallium nitride (GaN) transistors as the power transistors. In some embodiments, the transistors were enhancement mode high electron mobility transistors (eHEMT).

Various types of control schemes were used to control, or alternately drive, the eHEMTs. The control schemes utilized various circuits and methods to form the drive signals to enable and disable the eHEMTs. In some of the control schemes, it was difficult to control the gate-to-source voltage for the enable portion of the drive signal which could in some cases result in damaging the eHEMT. Some control schemes often had difficulty controlling the duration of the enable value of the drive signal which could result in reduced efficiency, such as for example reduced dynamic Rdson.

Accordingly, it is desirable to have a control method or device that has improved control of the enable value of the drive signal, that has improved control of the duration of the enable value of the drive signal, and/or and that has improved control of the timing of the enable value of the control signal.

Figure 1:
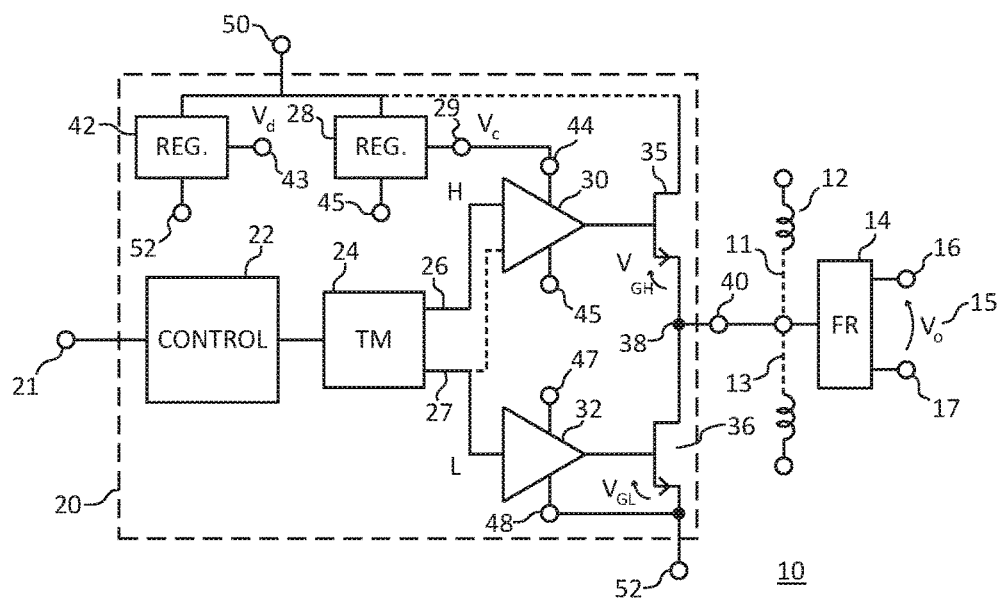
FIG. 1 schematically illustrates an example of an embodiment of a portion of a system for controlling GaN transistors in accordance with the present invention.

For simplicity and clarity of the illustration(s), elements in the figures are not necessarily to scale, some of the elements may be exaggerated for illustrative purposes, and the same reference numbers in different figures denote the same elements, unless stated otherwise. Additionally, descriptions and details of well-known steps and elements may be omitted for simplicity of the description. As used herein current carrying element or current carrying electrode means an element of a device that carries current through the device such as a source or a drain of an MOS transistor or an emitter or a collector of a bipolar transistor or a cathode or anode of a diode, and a control element or control electrode means an element of the device that controls current through the device such as a gate of an MOS transistor or a base of a bipolar transistor. Additionally, one current carrying element may carry current in one direction through a device, such as carry current entering the device, and a second current carrying element may carry current in an opposite direction through the device, such as carry current leaving the device. Although the devices may be explained herein as certain N-channel or P-channel devices, or certain N-type or P-type doped regions, a person of ordinary skill in the art will appreciate that complementary devices are also possible in accordance with the present invention. One of ordinary skill in the art understands that the conductivity type refers to the mechanism through which conduction occurs such as through conduction of holes or electrons, therefore, that conductivity type does not refer to the doping concentration but the doping type, such as P-type or N-type. It will be appreciated by those skilled in the art that the words during, while, and when as used herein relating to circuit operation are not exact terms that mean an action takes place instantly upon an initiating action but that there may be some small but reasonable delay(s), such as various propagation delays, between the reaction that is initiated by the initial action. Additionally, the term while means that a certain action occurs at least within some portion of a duration of the initiating action. The use of the word approximately or substantially means that a value of an element has a parameter that is expected to be close to a stated value or position. However, as is well known in the art there are always minor variances that prevent the values or positions from being exactly as stated. It is well established in the art that variances of up to at least ten percent (10%) (and up to twenty percent (20%) for some elements including semiconductor doping concentrations) are reasonable variances from the ideal goal of exactly as described. When used in reference to a state of a signal, the term "asserted" means an active state of the signal and the term "negated" means an inactive state of the signal. The actual voltage value or logic state (such as a "1" or a "0") of the signal depends on whether positive or negative logic is used. Thus, asserted can be either a high voltage or a high logic or a low voltage or low logic depending on whether positive or negative logic is used and negated may be either a low voltage or low state or a high voltage or high logic depending on whether positive or negative logic is used. Herein, a positive logic convention is used, but those skilled in the art understand that a negative logic convention could also be used. The terms first, second, third and the like in the claims or/and in the Detailed Description of the Drawings, as used in a portion of a name of an element are used for distinguishing between similar elements and not necessarily for describing a sequence, either temporally, spatially, in ranking or in any other manner. It is to be understood that the terms so used are interchangeable under appropriate circumstances and that the embodiments described herein are capable of operation in other sequences than described or illustrated herein. Reference to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but in some cases it may. Furthermore, the particular features, structures or characteristics may be combined in any suitable manner, as would be apparent to one of ordinary skill in the art, in one or more embodiments.

The embodiments illustrated and described hereinafter suitably may have embodiments and/or may be practiced in the absence of any element which is not specifically disclosed herein.

DETAILED DESCRIPTION

FIG. 1 schematically illustrates an example of an embodiment of a portion of a system 10 that utilizes Gallium Arsenide (GaN) transistors. The example embodiment of system 10 is configured as a synchronous buck power supply system that produces an output voltage (Vo) 15 between outputs 16 and 17. System 10 includes a power supply control circuit 20 that switches an inductor 12 to form the output voltage. Inductor 12 may be connected in various configurations, such as for example, between a voltage input and an output 40 of circuit 20 (as illustrated by dashed lines 11) or may be connected between output 40 and a common return (such as for example a ground reference, as illustrated by dashed lines 13). Inductor 12 may, in some embodiments, be connected to a filter circuit (FR) 14 that assists in forming output voltage 15.

Circuit 20 receives power for operating the circuits thereof between a voltage input 50 and a common return 52. In some embodiments, common return 52 may be connected to a common ground reference value. Circuit 20 may receive feedback information relating to output voltage 15 or the output current formed by system 10 in order to assist in regulating the value of output voltage 15. The feedback information may be received on one or more inputs that are represented by an input 21.

Circuit 20 may include transistors 35 and 36 that are configured to switch inductor 12 in order to regulate the value of output voltage 15. An embodiment may include that transistors 35 and 36 may be enhancement mode high electron mobility transistors (eHEMTs). An embodiment may also include that transistors 35 and 36 are connected together in a half H-bridge configuration, such as for example connected together in series, that has a common connection or bridge node 38. As will be seen further hereinafter, system 10 is merely a vehicle to explain an apparatus and a method of operation for transistors 35 and 36, and the method and apparatus are applicable to various other system configurations.

Circuit 20 may also include a control circuit 22 that forms control signals for regulating output voltage 15, a timing circuit (TM) 24 that forms control signals to operate transistors 35 and 36, a multi-level driver circuit 30 that is configured to form a control signal for enabling and disabling transistor 35, and a multi-level driver circuit 32 that is configured to form a control signal for enabling and disabling transistor 36. As will be seen further hereinafter, circuits 30 and 32 are configured to form multiple voltage levels for enabling and disabling respective transistors 35 and 36.

An embodiment of circuit 24 may be configured form a high-side control (H) signal for enabling transistor 35 and for forming and on-time of transistor 35. Circuit 24 may also be configured to form a low-side control (L) signal for enabling transistor 36 and for forming an on-time of transistor 36. As will be seen further hereinafter in the description of FIG. 3, an embodiment of circuit 30 may also receive the L signal, illustrated in general by a dashed line, to assist in the operation described for FIG. 3. Circuit 24 may also form a dead-time (DT) between asserted states of the H and L signals such that both the H and L signals are negated during the dead-time (DT). An embodiment of circuit 20 may also include a voltage regulator circuit 42 that receives the voltage from input 50, and forms an operating voltage ($V_D$) on an output 43 that is utilized for operating the elements of circuit 20 including circuits 22, 24, and 32. In an embodiment, voltage $V_D$ may be referenced to return 52.

Those skilled in the art will understand that an embodiment of circuit 30 may be referenced to a different common reference in order to provide sufficient drive to enable and disable transistor 35. For example, circuit 20 may also include another voltage regulator circuit 28 that receives the voltage from input 50, and forms an operating voltage ($V_C$) for operating circuit 30 and transistor 35. In an embodiment, circuit 28 may be referenced to the different common voltage for circuit 30 or to the source of transistor 35. For example, circuit 28 may be referenced to common terminal 45 of circuit 30, or alternately to node 38 thus to the source of transistor 35. Those skilled in the art will appreciate that the value of voltage $V_C$ as referenced to terminal 45 may be substantially the same value as voltage $V_D$ as referenced to return 52.

As illustrated by the dashed lines from transistor 35, transistors 35 and 36 may be connected to receive power from the voltage applied to input 50 or the voltage from output 29 or some other source of voltage. An embodiment may include that the voltage received by transistors 35 and 36 is no less than voltage $V_C$ on output 29.

Figure 2:
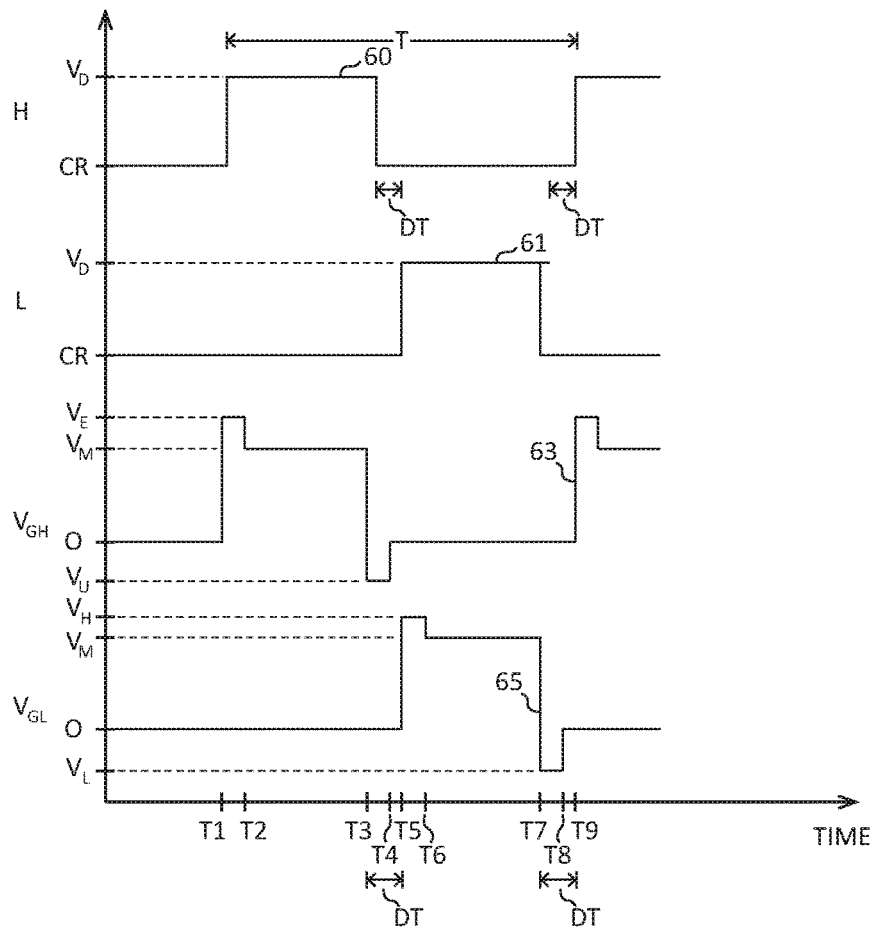
FIG. 2 is a graph having plots that illustrate an example of an embodiment of some of the signals that may be formed during the operation of an embodiment of the circuit of FIG. 1 in accordance with the present invention.

FIG. 2 is a graph having plots that illustrate an example of an embodiment of some of the signals that may be formed during the operation of an embodiment of circuit 20. The abscissa indicates time and the ordinate indicates increasing value of the illustrated signals. A plot 60 illustrates an embodiment of the H signal from circuit 24 and a plot 61 illustrates an embodiment of the L signal from circuit 24. A plot 63 illustrates a gate-to-source voltage ($V_{GH}$) of transistor 35 that is formed by circuit 30, and a plot 65 illustrates a gate-to-source voltage ($V_{GL}$) of transistor 36 that is formed by circuit 32. Those skilled in the art will appreciate that the $V_{GH}$ and $V_{GL}$ of respective transistors 35 and 36 is the gate voltage as referenced to the source voltage of the respective transistor. This description has references to FIG. 1 and FIG. 2.

Circuit 20 is configured to form an operating cycle having a period (T) that includes asserting both the H signal and the L signals to form respective on-time (OT) intervals and off-time intervals of respective transistors 35 and 36. The period (T) also includes a dead-time (DT) between the asserted times of the H and L signals such that both the H signal and the L signal are negated for the dead time (DT). Those skilled in the art will appreciate that there may be one dead-time between negating the H signal and then enabling the L signal (such as the interval between times T3 and T5), and a different dead-time between negating the L signal and asserting the H signal (such as the interval between times T7 and T9).

An embodiment of $V_{GH}$ and $V_{GL}$ each include an active interval (AI) and a non-active interval (NA). The active interval (AI) of the $V_{GH}$ and $V_{GL}$ signals is the time interval that the gate voltage is either greater than or less than the source voltage of the respective transistor. As will be seen further hereinafter, circuits 30 and 32 are configured to form the active interval of both the $V_{GH}$ and $V_{GL}$ signals to include an enable interval, a maintain interval, and a disable interval. The on-time (OT) of each of transistors 35 and 36 includes the enable interval and the maintain interval but not the disable interval. Drivers 30 and 32 are configured to form the enable interval in response to the asserted state of the respective H and L signal, and are configured to form the disable interval in response to the negated state of the respective H and L signal. An embodiment may include that the non-active interval (NA) of the $V_{GH}$ and $V_{GL}$ signals is the interval that the respective $V_{GH}$ and $V_{GL}$ signal is less than the threshold voltage of the respective transistor. In an embodiment, the $V_{GH}$ and $V_{GL}$ of respective transistors 35 and 36 may be substantially zero volts for the non-active interval (NA).

Assume that prior to a time T1 (FIG. 2), both the H and the L signals are negated and both $V_{GH}$ and $V_{GL}$ are non-active. At time T1, circuit 24 asserts the H signal and circuit 30 responsively forms the active interval of the $V_{GH}$ signal. Circuit 30 responsively forms the enable interval of $V_{GH}$, for example between times T1-T2, and forms $V_{GH}$ at an enable value ($V_E$) to initiate enabling transistor 35. The enable value ($V_E$) assists in rapidly enabling transistor 35. In an embodiment, the enable value ($V_E$) may be greater than the voltage ($V_C$). The enable value ($V_E$) is sufficiently large to transfer a charge to the gate of transistor 35 to rapidly form $V_{GH}$ at a value greater than the on-threshold value. An embodiment may include that circuit 30 forms the enable value substantially constant for the duration of the enable interval Forming the enable value to be substantially constant assists in controlling the enable value and the duration of the enable interval which reduces the stress applied to transistor 35 and minimizes damage thereto.

Circuit 30 is configured to terminate the enable interval and to decrease the value of the $V_{GH}$ signal after the enable time interval. Circuit 30 is configured to decrease the $V_{GH}$ value to a maintain value ($V_M$) that keeps transistor 35 enabled. Circuit 30 forms the maintain value for the maintain interval, for example between times T2 to T3. An embodiment may include that the maintain value ($V_M$) is greater than the on-threshold voltage of transistor 35. The enable value ($V_E$) is greater than the maintain value ($V_M$). An embodiment may include that the enable value ($V_E$) is at least one volt (1V) greater than $V_M$. Circuit 30 forms a duration of the enable interval. In an embodiment, the duration of the enable interval may be approximately ten percent to approximately twenty percent, or anywhere in between, of the duration of the maintain interval. An embodiment may include that the duration of the enable interval may be approximately ten nano-seconds to approximately twenty nano-seconds (10-20 nsec.). For the maintain interval (such as for example between times T2 to T3), Circuit 30 maintains the $V_{GH}$ signal at substantially $V_M$ so that transistor 35 can conduct current from the drain to source.

At a time T3, circuit 24 negates the H signal to terminate the on-time (OT) of transistor 35. In response to receiving the negated H signal, circuit 30 responsively forms the disable interval, for example between times T3 to 14, and forms the $V_{GH}$ signal at a disable value ($V_U$). The disable value ($V_U$) is a substantially negative value such that the gate voltage of transistor 35 is less than the voltage applied to the source of transistor 35. In an embodiment, circuit 30 forms the disable value to be substantially constant for the disable interval. Forming the value to be substantially constant assists in accurately controlling the value and reducing stress applied to transistor 35. Circuit 30 is also configured to accurately control the duration of the disable interval. Accurately controlling the value and duration assists in reducing stress applied to transistor 35 which assists in minimizing damage thereto and also minimizing losses during third quadrant conduction. Also, forming $V_{GH}$ to be a substantially negative value assists in rapidly disabling transistor 35 before enabling transistor 36. Additionally, the negative value minimizes dynamic coupling into the gate of transistor 35 and reduces the chance of unwanted enabling of transistor 35, which is especially helpful when time interval 14 is larger than or equal to interval T5. Circuit 30 forms a duration of the disable interval to be less than a duration of the maintain interval and less than a duration of the dead-time (DT). In an embodiment, the duration of the disable interval may be approximately ten percent to approximately twenty percent, or anywhere in between, of the duration of the dead-time (DT). An embodiment may include that the duration of the disable interval may be approximately ten nano-seconds to approximately twenty nano-seconds (10-20 nsec.).

At a time 14, circuit 30 is configured to terminate the disable interval and initiate forming the non-active interval of the $V_{GH}$ signal. As illustrated by plots 60 and 63, the time interval that circuit 30 forms the $V_{GH}$ signal at the negative value of the disable interval ($V_U$) is less than the dead-time (DT) between times T3 and T5. In an embodiment, circuit 30 may be configured to form the duration of the disable interval as approximately ten percent to approximately twenty percent, or anywhere in between, of the duration of the dead-time. Those skilled in the art will appreciate that the active interval (AI) of the $V_{GH}$ signal is longer than the on-time formed by the H signal.

An embodiment of circuit 32 is configured to function similarly to circuit 30. At time T5, circuit 24 asserts the L signal and circuit 32 responsively forms the active interval (AI) of the $V_{GL}$ signal. Circuit 30 responsively forms the enable interval, for example between times T5-T6, and forms $V_{GL}$ at an enable value ($V_H$) to initiate enabling transistor 36. The enable value ($V_H$) assists in rapidly enabling transistor 36. In an embodiment, the enable value ($V_H$) may be greater than the operating voltage ($V_D$). The enable value ($V_H$) is sufficiently large to transfer a charge to the gate of transistor 36 to rapidly form $V_{GL}$ at a value greater than the on-threshold value. An embodiment may include that circuit 32 forms the enable value substantially constant for the duration of the enable interval. Forming the enable value to be substantially constant assists in controlling the enable value and the duration of the enable interval which reduces the stress applied to transistor 36 and minimizes damage thereto.

Circuit 32 is configured to terminate the enable interval, for example at a time T6, and to decrease the value of the $V_{GL}$ signal to a maintain value ($V_M$) that keeps transistor 35 enabled. Circuit 32 forms the maintain value for the maintain interval, for example between times T6 to T7. An embodiment may include that the maintain value ($V_M$) is greater than the on-threshold voltage of transistor 36. The enable value ($V_H$) is greater than the maintain value ($V_M$). An embodiment may include that the enable value ($V_H$) is at least one volt (1V) greater than $V_M$. Circuit 32 forms a duration of the enable interval to be less than a duration of the maintain interval. In an embodiment, circuit 32 may be configured to form the duration of the enable interval to be approximately ten percent to approximately twenty percent, or anywhere in between, of the duration of the maintain interval. An embodiment may include that the duration of the enable interval may be approximately ten nano-seconds to approximately twenty nano-seconds (10-20 nsec.). Circuit 32 maintains the $V_{GL}$ signal at substantially $V_M$ so that transistor 36 can conduct current from the drain to source.

At a time T7, circuit 24 negates the L signal to terminate the on-time of transistor 36. In response to receiving the negated L signal, circuit 32 responsively forms the disable interval, for example between times T7 to T8, and forms the $V_{GL}$ signal at a disable value ($V_L$). The disable value ($V_L$) is a substantially negative value such that the gate voltage of transistor 36 is less than the voltage applied to the source of transistor 36. In an embodiment, circuit 32 forms the disable value to be substantially constant for the disable interval. Forming the value to be substantially constant assists in accurately controlling the value and reducing stress applied to transistor 36. Circuit 32 is also configured to accurately control the duration of the disable interval. Accurately controlling the value and duration assists in reducing stress applied to transistor 36 which assists in minimizing damage thereto. Also, forming $V_{GL}$ to be a substantially negative value assists in rapidly disabling transistor 36 before again enabling transistor 35, and also improves the dynamic on-resistance (Rdson) of transistor 36. Circuit 32 is configured to form the duration of the disable interval to be less than the duration of the maintain interval or of the dead-time (DT). In an embodiment, circuit 32 may be configured to form the duration of the disable interval to be approximately ten percent to approximately twenty percent, or anywhere in between, of the duration of the dead-time (DT). An embodiment may include that the duration of the disable interval may be approximately ten nano-seconds to approximately twenty nano-seconds (10-20 nsec.).

At a time T8, circuit 32 terminates the disable interval and initiates forming the non-active interval of the $V_{GL}$ signal. As illustrated by plots 61 and 65, the time interval that the $V_{GL}$ signal is at the negative value ($V_L$) of the disable interval is less than the dead-time (DT) between times T8 and T9. In an embodiment, circuit 32 may be configured to form the duration of the disable interval to be approximately ten percent to approximately twenty percent, or anywhere in between, of the duration of the dead-time (DT). Those skilled in the art will appreciate that the active interval of $V_{GL}$ is greater than the on-time formed by the L signal.

At time T9, circuit 24 again asserts the H signal to initiate another cycle.

An embodiment may include that the enable values $V_H$ and $V_E$ may be substantially the same. An embodiment may include that the disable values $V_U$ and $V_L$ may substantially the same. In an example embodiment, the operating voltage value ($V_D$), and the voltage $V_C$ as referenced to terminal 45, may be approximately five volts (5V), the enable values $V_E$ and $V_H$ may be approximately one volt greater than respective voltages $V_C$ and $V_D$, for example six volts (6V), and the disable values $V_U$ and $V_L$ may be two to five volts (2-5V) less than the source voltage.

Figure 3:
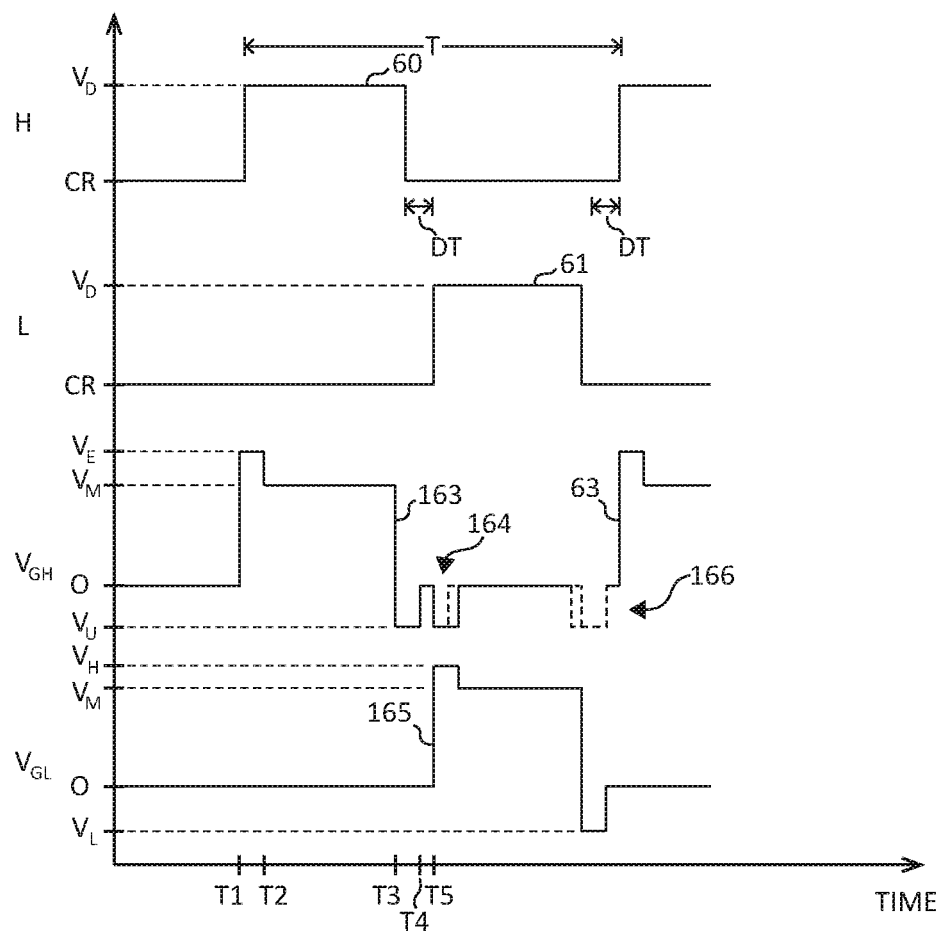
FIG. 3 is a graph having plots that illustrate an example of an embodiment of some of signals that may be formed during an alternate operation of an alternate embodiment of some of the circuits of FIG. 1 in accordance with the present invention.

FIG. 3 is a graph having plots that illustrate an example of an embodiment of some of signals that may be formed during an alternate operation of an alternate embodiment of circuit 20. The abscissa indicates time and the ordinate indicates increasing value of the illustrated signals. A plot 163 illustrates the gate-to-source voltage ($V_{GH}$) of transistor 35 that is formed by circuit 30, and a plot 165 illustrates a gate-to-source voltage ($V_{GL}$) of transistor 36 that is formed by circuit 32. This description has references to FIG. 1 and FIG. 3.

Circuit 32 is configured to operate substantially as described in the explanation of FIGS. 1-2. However, an embodiment of circuit 30 may be configured to form the $V_{GH}$ for transistor 35 to include multiple negative pulses in addition to the disable interval explained in the description of FIGS. 1-2. From times T1 to T4, circuit 30 forms $V_{GH}$ substantially the same as illustrated in FIG. 2 and as explained in the descriptions thereof. At time T5, circuit 24 asserts the L signal to form the on-time for transistor 36 and circuit 32 responsively forms the enable interval of the $V_{GL}$ signal.

Circuit 30 may be configured to form a second disable interval for transistor 35 such that the second disable interval overlaps the positive edge of the $V_{GL}$ signal. The second disable interval is illustrated in a general manner by interval 164 in FIG. 3. Circuit 30 may be configured to form the second disable interval in response to the asserted state of the L signal and to form the second disable interval prior to the $V_{GL}$ positive edge. An embodiment of circuit 30 may also form the second disable interval to overlap the $V_{GL}$ positive edge. Circuit 30 may have an embodiment that forms the second disable interval to continue for a brief time after the $V_{GL}$ positive edge. Forming the second disable interval of the $V_{GH}$ signal to at least overlap the $V_{GL}$ positive edge assists in minimizing false enabling of transistor 35 due to noise created by enabling transistor 36.

In another alternate embodiment, circuit 30 may be configured to form a third disable interval illustrated in a general manner by interval 166 in plot 163. Circuit 30 may be configured to form the third disable interval in response to the negated state of the L signal. Circuit 30 may be configured to form the third disable interval to overlap the $V_{GL}$ disable interval that is formed by circuit 32 in response to the disabled state of the L signal. An embodiment of circuit 30 may be configured to form the third disable signal just prior to the disable interval of the $V_{GL}$ signal. In an embodiment, circuit 30 may be configured to form the third disable interval for the $V_{GH}$ signal to overlap a portion of the $V_{GL}$ disable interval. An embodiment of circuit 30 may be configured to terminate the third disable interval prior to or no later than forming the enable interval $V_E$.

Figure 4:
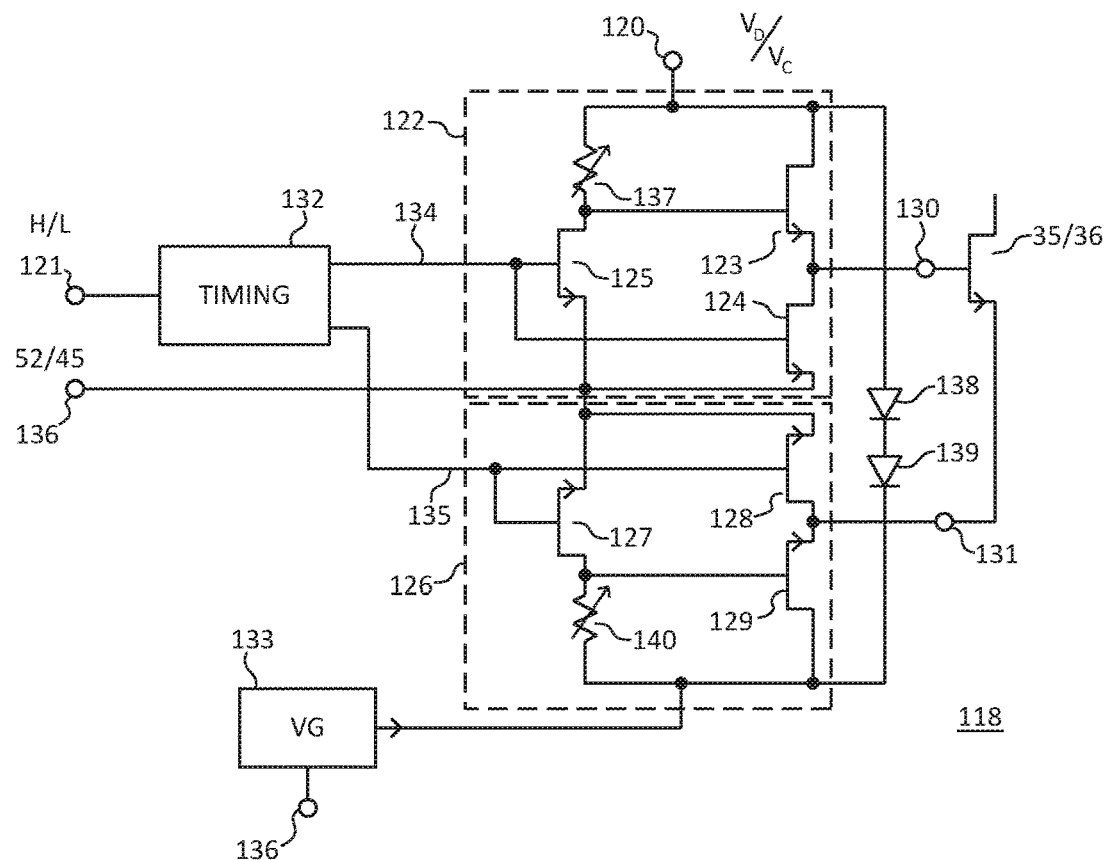
FIG. 4 schematically illustrates a portion of an example of an embodiment of a circuit that may have an embodiment that may be an alternate embodiment of some of the circuits of FIG. 1 in accordance with the present invention.

FIG. 4 schematically illustrates a portion of an example of an embodiment of a driver circuit 118 that may have an embodiment that may be an alternate embodiment of either one of or both of drivers 30 and/or 32 (FIG. 1). Circuit 118 includes an input 121 that is configured to receive a control signal, such as either of the H or the L control signals from circuit 24 (FIG. 1), and is configured to form respective $V_{GH}$ and $V_{GL}$ signals between outputs 130 and 131. An input terminal 120 is configured to receive the output voltages from the respective outputs 29 or 43, and a reference input 136 is configured to be connected to the respective reference voltage on terminal 45 or return 52. Output 130 is configured to be connected to the gate of the transistor that is being controlled, such as respective transistors 35 or 36, and output 131 is configured to be connected to the source of that transistor.

Circuit 118 includes a main driver circuit 122, a negative pulse circuit 126, and a timing circuit 132 that controls the timing of some of the various voltage levels formed on outputs 130 and 131. For example, at least the value and the duration of the disable interval. A voltage generation circuit 133 is configured to generate a voltage for forming the negative values for the $V_{GS}$ (such as for example the $V_U$ and the $V_L$ values). Circuit 122 includes transistors 123-125 and a GaN variable resistance element 137. Circuit 126 includes transistors 127-129 and a GaN variable resistance element 140. The operation and characteristics of GaN variable resistance elements are well known to those skilled in the art.

Figure 5:
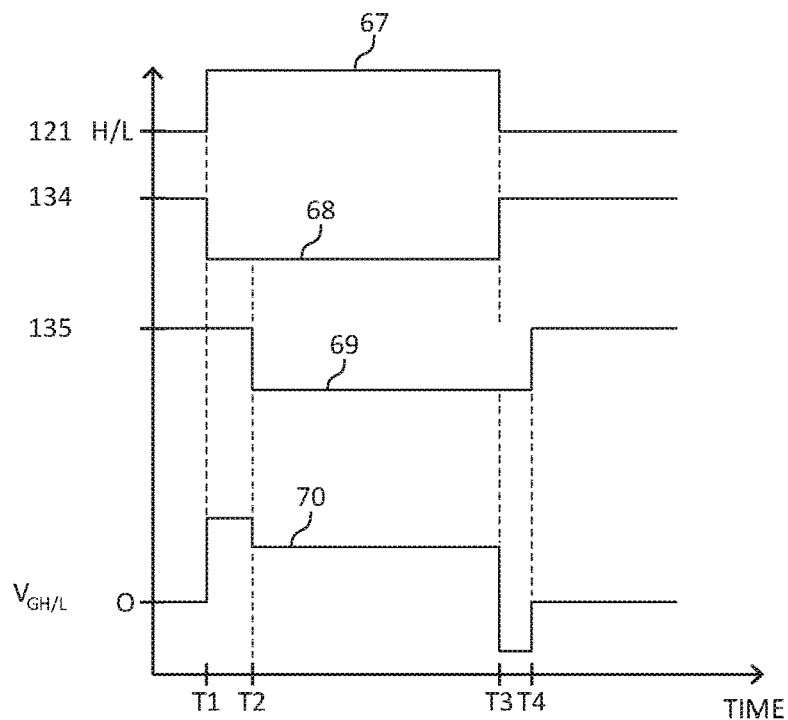
FIG. 5 is a graph having plots that illustrate an example of an embodiment of some of the signals that may be formed during the operation of an embodiment of the circuit of FIG. 4 in accordance with the present invention.

FIG. 5 is a graph having plots that illustrate an example of an embodiment of some of the signals that may be formed during the operation of an embodiment of circuit 118. The abscissa indicates time and the ordinate indicates increasing value of the illustrated signals. A plot 67 illustrates an embodiment of the signal that is received on input 121. A plot 68 illustrates a timing signal 134 that is formed by circuit 132 and received by circuit 122, a plot 69 illustrates a timing signal 135 that is formed by circuit 132 and is received by circuit 126, and a plot 70 illustrates the $V_{GH}/V_{GL}$, signal that is formed by circuit 118, for example at output 130 as referenced to output 131. This description has references to FIGS. 4 and 5.

Those skilled in the art will appreciate that the asserted state of signals 134 and 135 is a low value such that signals 134 and 135 use negative logic for the asserted state. At a time just before T1, circuit 132 receives the asserted state of the signal on input 121 and at time T1 responsively asserts signal 134 (low value). The asserted state of signal 134 disables transistors 124-125. The gate of transistor 123 is charged through element 137 which at this time has a low resistance and a corresponding low voltage drop across element 137. Element 137 causes output 130 to be rapidly pulled to a value substantially equal to the voltage on input 120, for example substantially equal to $V_C$ or $V_D$, and to rapidly charge the gate of the transistor connected to output 130. Circuit 132 is configured to maintain signal 135 negated (a high value) at this time. The negated signal 135 enables transistors 127-128 and disables transistor 129. Thus, at time T1 the source of the transistor on output 131 is at substantially the value of the voltage on input 136 (such as terminal 45 or return 52). Consequently, the gate voltage is greater than the source.

At time T2, circuit 132 asserts signal 135 (low value). Asserting signal 135 (low value) disables transistors 127-128 and enables transistor 129. Enabling transistor 129 couples the voltage from circuit 133 to output 131 and to the source of the transistor on output 131. This reduces the Vgs of the transistor by the amount of voltage from circuit 133 as illustrated at time T2. Thus, circuit 118 is configured to terminate the enable interval. However, the gate voltage is still greater than the source and the transistor remains enabled, as illustrated by plot 70 (and also by plot 65 of FIG. 2).

At a time T3, the signal on input 121 is negated, and circuit 132 responsively negates signal 134 (high value) and keeps signal 135 asserted (low value). Negating signal 134 enables transistors 124-125 and disables transistor 123. Disabling transistor 123 decouples output 130 from the input voltage and enabling transistor 124 connects output 130 to the value received on input 136. Keeping signal 135 asserted (low value) continues to couple the voltage from circuit 133 to output 131 and to the source of the transistor. Because output 130 is at substantially the voltage on input 136, output 131 applies a higher voltage value to the source than is applied to the gate thereby forming a negative $V_{GS}$ for the transistor. Thus, the gate connected to output 130 is rapidly discharged in a controlled manner which reduces damage to the transistor. Also, element 137 has a high resistance and has a high voltage drop which minimizes power losses due to leakage currents.

At time T4, circuit 132 negates signal 135 (high value). The negated signal 135 disables transistor 129 and enables transistors 127-128 which connects output 131 and the source of the transistor to input 136. Thus, the gate and the source are at substantially the same voltage and the $V_{GS}$ is substantially zero.

In an optional embodiment, circuit 118 may include a plurality of diodes, illustrated in a general manner by diodes 138-139, instead of circuit 133. Diodes 138-139 form a voltage that is used to form the negative values $V_U$ and $V_L$ for respective transistors 35 and 36.

In order to assist in providing the hereinbefore described functionality, input 121 of circuit 132 is connected to receive either the H signal or the L signal from circuit 24 (FIG. 1). An output of circuit 132 is connected to form signal 134 and is commonly connected to a gate of transistor 125 and a gate of transistor 124. A first terminal of element 137 is connected to input 120 and a second terminal is commonly connected to the gate of transistor 123 and to a drain of transistor 125. A source of transistor 125 is connected to input 136. A drain of transistor 123 is connected to input 120 and a source of transistor 123 is commonly connected to output 130 and a drain of transistor 124. A source of transistor 124 is connected to input 136. A second output of circuit 132 forms signal 135 and is commonly connected to a gate of transistor 127 and a gate of transistor 128. A source of transistor 127 is commonly connected to input 136 and a source of transistor 128. A drain of transistor 128 is commonly connected to output 131 and a source of transistor 129. A drain of transistor 129 is commonly connected to an output of circuit 133, and to a first terminal of element 140. A second terminal of element 140 is commonly connected to the gate of transistor 129 and a drain of transistor 127. A reference input of circuit 133 is connected to input 136.

Figure 6:
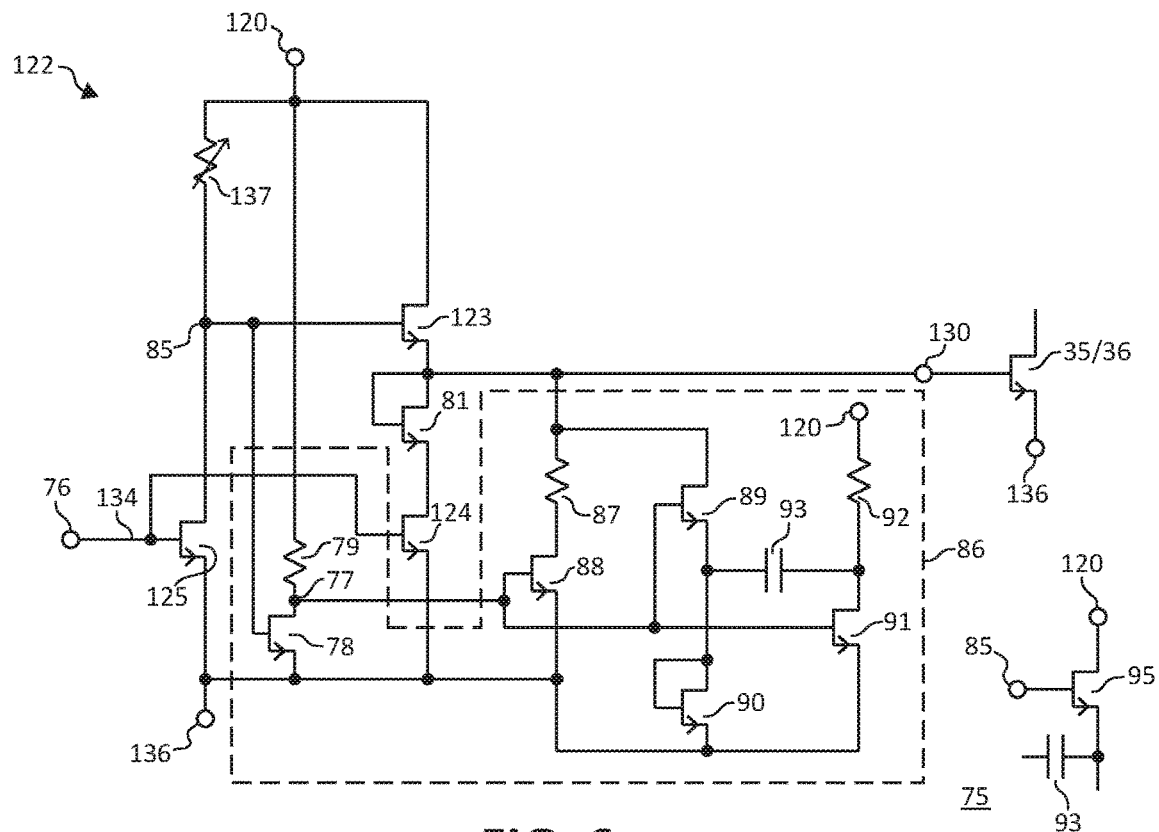
FIG. 6 schematically illustrates an example of an embodiment of a portion of an embodiment of a circuit that may have an embodiment that may be an alternate embodiment of a portion of some of the circuits of FIG. 1 or FIG. 4 in accordance with the present invention.

FIG. 6 schematically illustrates an example of an embodiment of a portion of an embodiment of a driver circuit 75 that may have an embodiment that may be an alternate embodiment of a portion of either or both of circuits 30 or 32 (FIG. 1) or circuit 118 (FIG. 4). Circuit 75 includes a negative pulse circuit 86 that is configured to form the disable interval and disable value of the $V_{GS}$ of either of transistors 35 ($V_U$) or 36 ($V_L$). An input 76 is configured to receive signal 134 from circuit 132 (FIG. 4). Additionally, transistor 81 is added to circuit 122.

In response to the asserted state of signal 134 (low value), transistor 125 is disabled which enables transistor 78 and pulls node 77 low. The low at node 77 disables transistors 88, 89 and 91 so that capacitor 93 charges through resistor 92 and diode connected transistor 90. Thus, capacitor 93 charges to a value of substantially the value on input 120, such as $V_C$ or $V_D$. Those skilled in the art will appreciate that resistor 92 may optionally be replaced with a transistor 95.

In response to the negated state of signal 134 (high value) such as at time T3 in FIG. 5, circuit 86 enables transistor 125 which disables transistor 78 and pulls node 77 high. The high on node 77 enables transistors 88-89 and 91. Enabling transistor 89 connects the plate of capacitor 93 to output 82 and thereby forcing a negative voltage at output 130 relative to input 136 which forms the negative $V_{GS}$ value for the transistor connected to output 130. An embodiment may include that diode connected transistor 81, coupled between output 130 and transistor 124, assists in forming output 130 negative with respect to input 136. In other words, upon discharging output 130 through transistor 124, transistor 81 provides a conductive path to input 136 until output 130 reaches a voltage substantially equal to the threshold voltage of transistor 81 above the voltage of input 136; transistor 81 subsequently blocks a conductive path to transistor 124 when resistor 87 is further discharging output 130 towards input 136, as well as when capacitor 93 is pumping output 130 negative versus input 136.

Those skilled in the art will appreciate that circuit 75 does not form the disable value to be substantially constant for the duration of the disable interval. However, circuit 75 connects the gate and source of the transistor to capacitor 93 without any extra resistors in the current path between capacitor 93 and the gate. Thus, circuit 75 does not have resistors in the gate current flow path to limit the value of the current or charge supplied to the gate. Thus, the gate connected to output 130 is rapidly discharged in a controlled manner which reduces damage to the transistor.

Additionally, circuit 75 does not limit the current provided by transistor 123 upon charging output 130 to enable the respective transistor 35 or 36, nor does it limit the current provided by transistor 124 upon discharging output 130 to disable the respective transistor 35 or 36. Circuit 75 may, in an embodiment, be considered as connected in parallel to circuit 122. Those skilled in the art should realize that a similar circuit topology can be derived to pulse the gate positive, e.g. by pre-charging a capacitor to a value of substantially the value on input 120, and subsequently switching the bottom plate of that pre-charged capacitor towards terminal 120 while coupling the positive terminal of the pre-charged capacitor to output 130.

In order to assist in providing the hereinbefore described functionality, a gate of transistor 78 is connected to node 85. A source of transistor 78 is connected to input 136. A drain of transistor 78 is commonly connected to node 77, a first terminal of resistor 79, a gate of transistor 88, a gate of transistor 89, and a gate of transistor 91. A second terminal of resistor 79 is connected to input 120. A source of transistor 88 is commonly connected to the source of transistor 78, a source of transistor 99, and a source of transistor 91. A drain of transistor 88 is connected to a first terminal of resistor 87 which has a second terminal connected to a drain of transistor 89. A source of transistor 89 is commonly connected to a first terminal of capacitor 93, to a drain of transistor 99, and to a gate of transistor 99. A second terminal of capacitor 93 is connected to a drain of transistor 91 and a first terminal of resistor 92. A second terminal of resistor 92 is connected to input 120.

Figure 7:
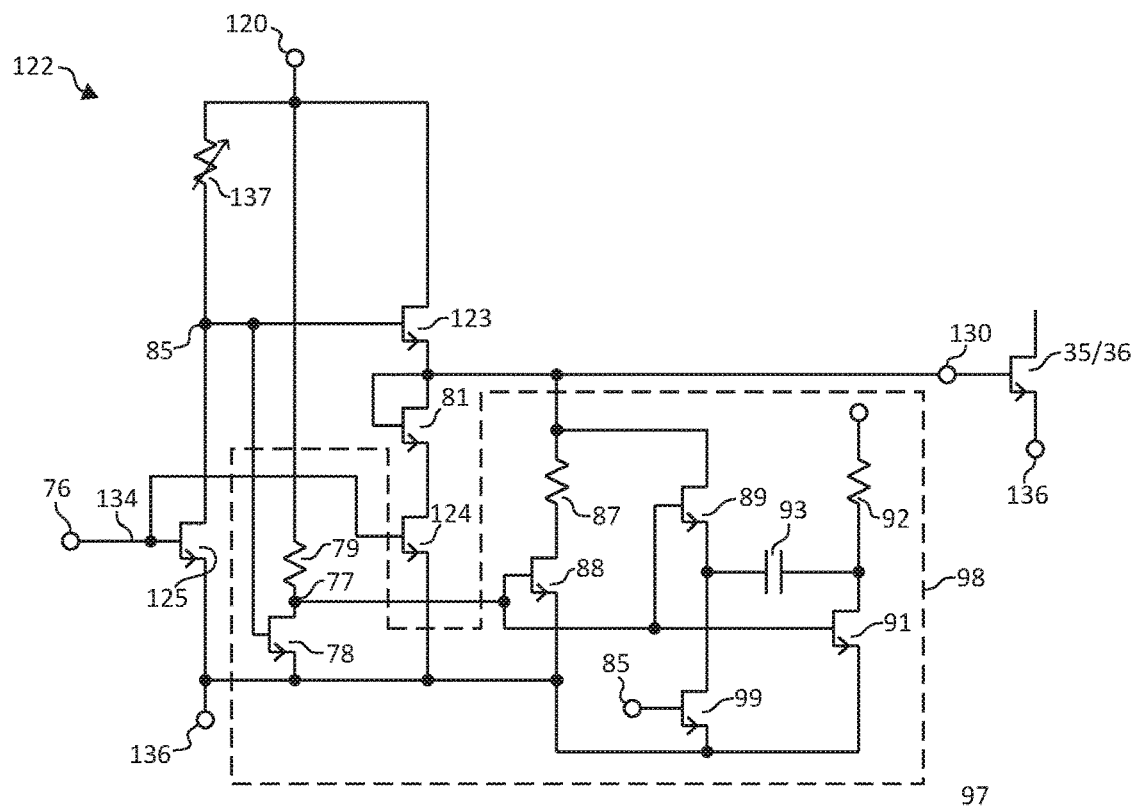
FIG. 7 schematically illustrates an example of a portion of an embodiment of a circuit that may have an embodiment that may be an alternate embodiment of the circuit of FIG. 6 in accordance with the present invention.

FIG. 7 schematically illustrates an example of a portion of an embodiment of a driver circuit 97 that may have an embodiment that may be an alternate embodiment of circuit 75 (FIG. 6). Circuit 97 is substantially the same as circuit 75 except that circuit 97 includes a negative pulse circuit 98 that is an alternate embodiment of circuit 86. Circuit 98 is substantially the same as circuit 86 except that diode connected transistor 90 of circuit 86 is replaced with a transistor 99 that is controlled by the voltage at node 85. In response to the negated state of signal 134, transistor 99 is enabled to connect capacitor 93 to output 130. Using a control signal to enable transistor 99 instead of using diode connected transistor 90, provides more accurate control of the timing and duration of the disabled interval. In other embodiments, transistor 99 may be controlled by other signals such as for example the signal on output 130, or any signal that has the same polarity and timing as node 85.

Figure 8:
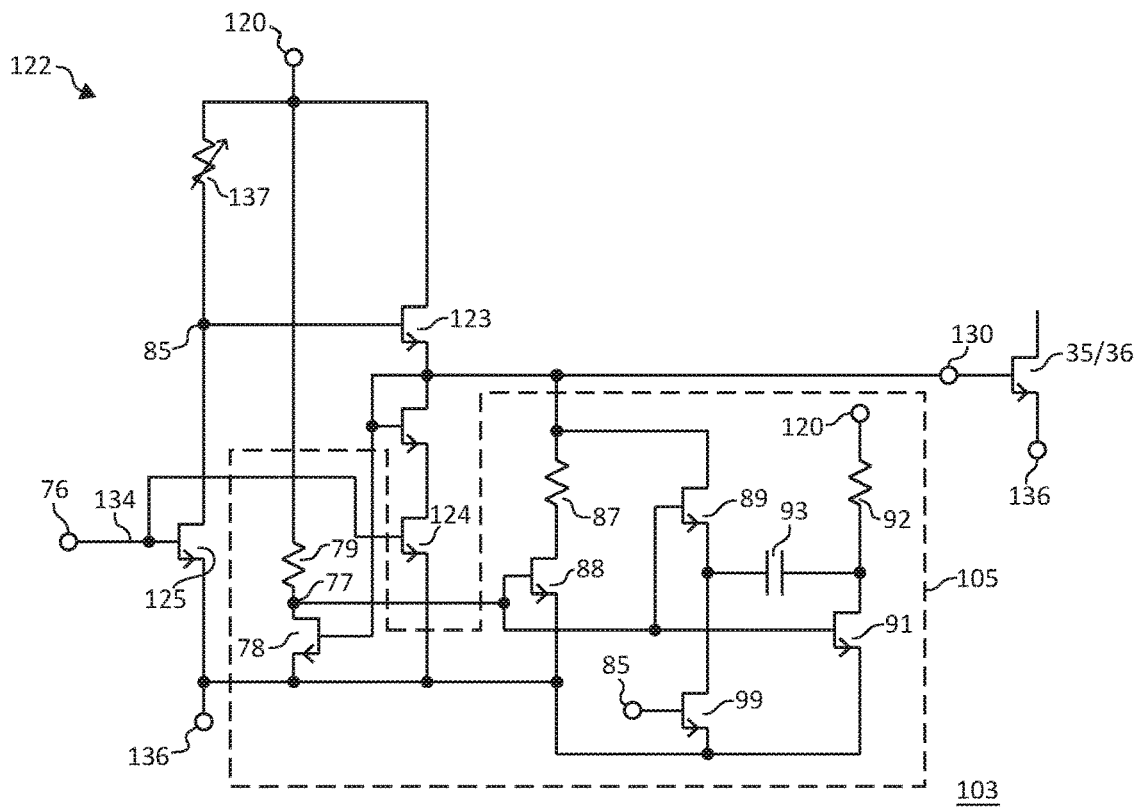
FIG. 8 schematically illustrates an example of a portion of an embodiment of a circuit that may have an embodiment that may be an alternate embodiment of some of the circuits of FIG. 4 or 6-7 in accordance with the present invention.

FIG. 8 schematically illustrates an example of a portion of an embodiment of a driver circuit 103 that may have an embodiment that may be an alternate embodiment of any of drivers 75 or 97. Circuit 103 is substantially the same as circuit 97 except that circuit 103 includes a negative pulse circuit 105 that is an alternate embodiment of circuit 98. Circuit 105 is substantially the same as circuit 98 except that transistor 78 is controlled by output signal 130. Thus, transistor 78 functions as a comparator that detects the gate signal on output 130 decreasing, and responsively enables circuit 105 to form the disable voltage and disable interval duration.

Figure 9:
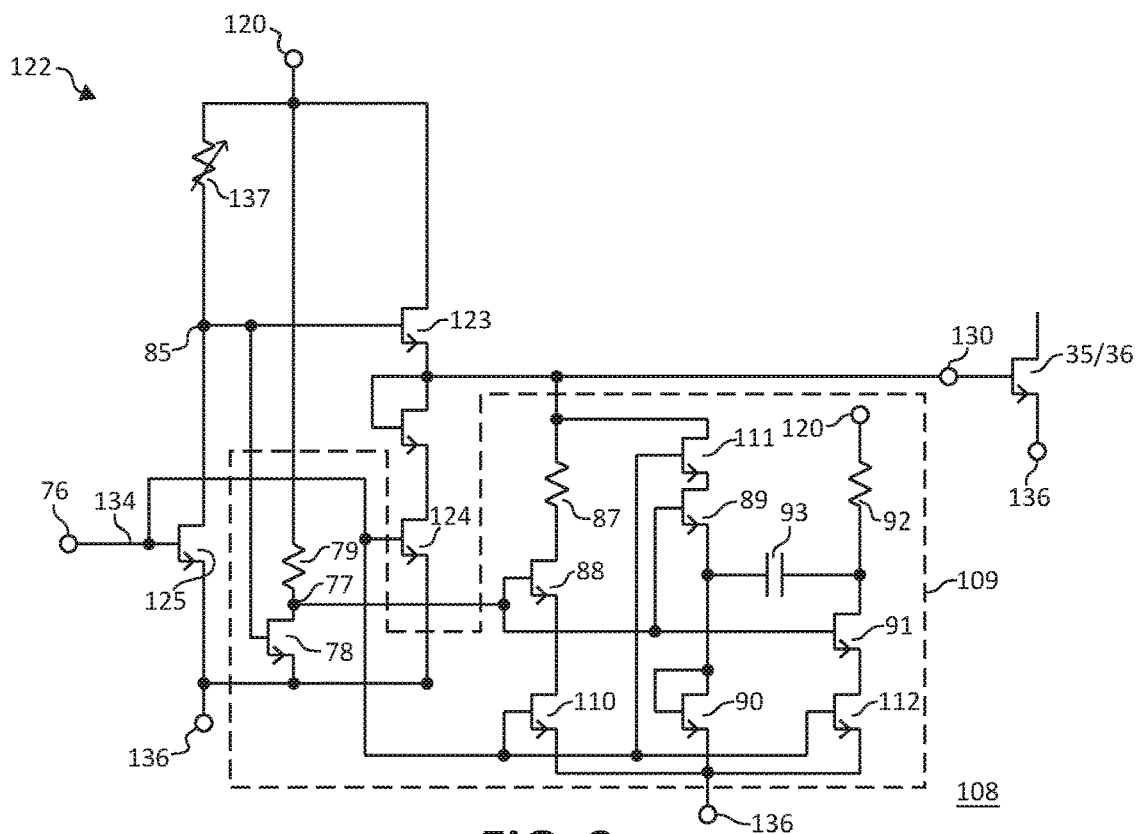
FIG. 9 schematically illustrates an example of a portion of an embodiment of a circuit that may have an embodiment that may be an alternate embodiment of some of the circuits of FIG. 4 or 6-7 in accordance with the present invention.

FIG. 9 schematically illustrates an example of a portion of an embodiment of a driver circuit 108 that may have an embodiment that may be an alternate embodiment of any of drivers 75 or 97 or 103. Circuit 108 is substantially the same as circuit 75 (FIG. 6) except that circuit 108 includes a negative pulse circuit 109 that is an alternate embodiment of circuit 86. Circuit 109 is substantially the same as circuit 86 except that circuit 109 includes additional transistors 110-112 in series with respective transistors 88, 89, and 91 such that two control signals are used for forming the timing of the disable interval. Transistors 110-112 are controlled by input signal 134. Thus, both signal 134 has be negated (high value) and node 77 has to have a high value to form the disable interval and the disable value. These two signals both have a high value for a very short time interval which forms a short time interval for the disable interval. This allows for transistor 123 to discharge output 130 before the negative pulse from capacitor 93 is applied to output 130, otherwise capacitor 93 would be discharged prematurely (by transistor 123).

In an alternate embodiment, transistor 90 may be replaced by transistor 99 of FIG. 7.

Figure 10:
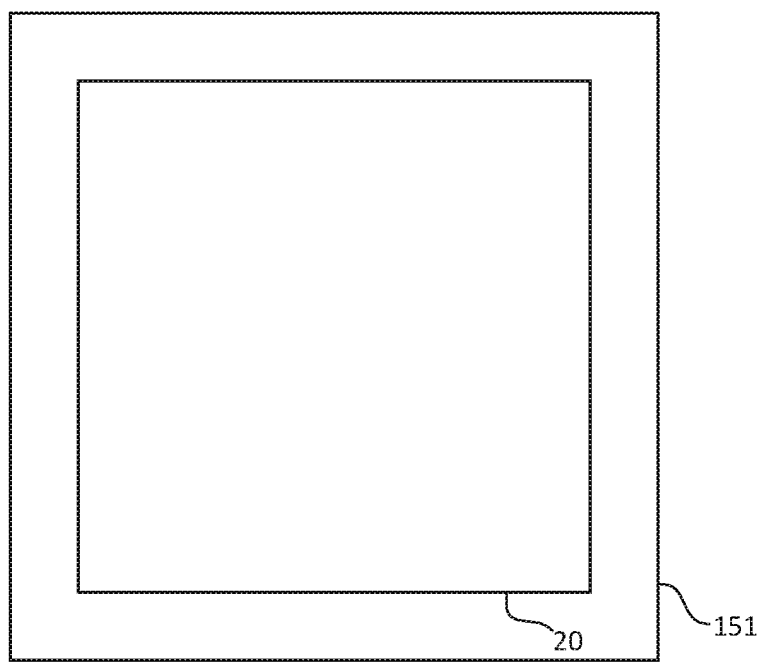
FIG. 10 illustrates an enlarged plan view of a semiconductor device that includes some of the circuits of any of FIG. 1, 3, 4, or 7-9 in accordance with the present invention.

FIG. 10 illustrates an enlarged plan view of a portion of an embodiment of a semiconductor device or integrated circuit 150 that is formed on a semiconductor die 151. In an embodiment, any one of circuits 20, 118, 75, 97, 103, or 108. Die 151 may also include other circuits that are not shown in FIG. 10 for simplicity of the drawing. Device or integrated circuit 150 may be formed on die 151 by semiconductor manufacturing techniques that are well known to those skilled in the art.

In view of the explanations herein, one skilled in the art will appreciate that an example of an embodiment of a method of controlling a gallium nitride switch may comprise:

configuring a first driver circuit, such as for example circuit 30, to form a first Vgs for a first GaN switch, such as for example switch 35, and configuring a second driver circuit, such as for example circuit 32, to form a second Vgs for a second GaN switch, such as for example switch 36, wherein the first GaN switch and the second GaN switch are configured for coupling together at a bridge node and wherein the first driver circuit and the second driver circuit are configured receive an operating voltage between a voltage input and a common return;

configuring the first driver circuit to enable the first GaN switch by forming the first Vgs as a first value, such as for example value VT, greater than substantially the operating voltage, such as for example the voltage at one of 44/45, for a first time interval, such as for example starting at T1, wherein the first value is substantially constant for the first time interval, the first driver circuit configured to subsequently for a second time interval, such as for example starting at T2, form the first Vgs as a second value, such as for example value VD, that is less than the first value and greater than a first threshold value of the first GaN switch; and configuring the second driver circuit to enable the second GaN switch by forming the second Vgs as a third value, such as for example value VH, greater than substantially the operating voltage for a third time interval, such as for example starting at T5, wherein the third value is substantially constant for the third time interval, the second driver circuit configured to subsequently for a fourth time interval, such as for example starting at T6, to form the second Vgs as a fourth value, such as for example value VL, that is less than the third value and greater than a second threshold value of the second GaN switch wherein the third time interval is subsequent to the second time interval.

An embodiment of the method may also include configuring the first driver circuit to disable the first GaN switch by forming the first Vgs as a fifth value that is negative for a fifth time interval, such as for example T3-T4, wherein the fifth time interval is after the second time interval and is prior to the third time interval, and wherein the fifth value is substantially constant for the fifth time interval.

Another embodiment may include configuring the first driver circuit to form the first Vgs as a sixth value that is negative for a sixth time interval wherein the sixth time interval overlaps at least a portion of the third time interval.

An embodiment may include configuring the second driver circuit to disable the second GaN switch by forming the second Vgs as sixth value that is negative for a sixth time interval wherein the sixth time interval is after the fourth time interval, and wherein the sixth value is substantially constant for the sixth time interval.

The method of claim 4 further including configuring the first driver circuit to form the first Vgs as a seventh value that is negative for a seventh time interval, such as for example FIG. 3/166, wherein the seventh time interval overlaps at least a portion of the sixth time interval.

The method may have an embodiment that may include configuring the first driver circuit to include a main driver circuit, such as for example circuit 122, configured to couple a gate of the first GaN switch to receive the operating voltage for the second time interval.

Another embodiment may include configuring the first driver circuit to include a negative pulse circuit, such as for example circuit 126, configured to couple a source of the first GaN switch to the common return for the second time interval.

An embodiment may include configuring the main driver circuit to couple the gate of the first GaN switch to the common return voltage for a fifth time interval that is after the second time interval and prior to the third time interval.

The method may have an embodiment that may include configuring the first driver circuit to include a negative pulse circuit, such as for example circuit 126, configured to couple a source of the first GaN switch to a voltage greater than the common return voltage for the fifth time interval.

Those skilled in the art also appreciate that an example of an embodiment of a circuit for controlling GaN transistors may comprise:

a first circuit, such as for example circuit 30, configured to control a first Vgs for a first GaN transistor that is coupled to a second GaN transistor wherein the first circuit is configured to form the first Vgs as a first negative value, such as for example value VU, wherein the first circuit forms the first negative value for a first time interval, such as for example starting at time T3;

a second circuit, such as for example circuit 32, configured to control a second Vgs for the second GaN transistor wherein the second circuit is configured to form the second Vgs as a second value, such as for example value VD, for a second time interval, such as for example starting at T5, to enable the second GaN transistor and wherein the second time interval is subsequent to the first time interval;

the first circuit configured to form the first Vgs as the first negative value for a third time interval that overlaps at least a portion of the second time interval;

the second circuit configured to form the second Vgs as a third value, such as for example value VL, that is a second negative value for a fourth time interval to disable the second GaN transistor wherein the fourth time interval is subsequent to the third time interval; and the first circuit configured to form the first Vgs as the first negative value for a fifth time interval that overlaps at least a portion of the fourth time interval.

An embodiment may include that the first circuit forms the third time interval, such as for example overlaps at least a portion of T5, no later than the second circuit forms the second time interval.

In an embodiment, the first circuit may form the third time interval after the second circuit forms the second time interval.

An embodiment may include that the first circuit forms the third time interval to have a duration that is less than the second time interval.

Another embodiment may include that the first circuit forms the fifth time interval no later than the second circuit forms the fourth time interval.

An embodiment may include that the first circuit forms the fifth time interval after the second circuit forms the fourth time interval.

An embodiment may include that the first circuit forms the fifth time interval to have a duration that is less than the fourth time interval.

Those skilled in the art also appreciate that an example of an embodiment of a method of forming a semiconductor device may comprise:

forming a first circuit to control a first Vgs of a first HEMT;

forming a second circuit, such as for example circuit 32, to control a second Vgs of a second HEMT, such as for example transistor 36, that is coupled to the first HEMT; and forming the first circuit to form the first Vgs at a first negative value, such as for example value VU, for at least a portion of a first time interval, such as for example near time T5, that the second circuit enables the second HEMT.

The method may have an embodiment that may include forming the first circuit to form the first Vgs at the first negative value for at least a portion of a second time interval, such as for example near time T7, that the second circuit disables the second HEMT.

An embodiment may include forming the second circuit to form the second Vgs of the second HEMT at a second value for the first time interval wherein the second value is positive.

An embodiment may include forming the second circuit to form the second Vgs of the second HEMT at the second value for the first time interval.

In view of all of the above, it is evident that a novel device and method is disclosed. Included, among other features, is forming a circuit that forms the enable value and the disable value of the VGS of a transistor to be a substantially constant value during the enable interval and during the disable interval. The circuit also accurately controls a duration of the enable interval and the disable interval. Such control reduces the amount of time that the enable value and the disable values are applied to the transistor which reduces the stress and improves the lifetime of the transistor. Accurately controlling the duration of the enable and disable intervals also improves the dynamic on resistance ($R_{DSON}$) of the transistor.

While the subject matter of the descriptions are described with specific preferred embodiments and example embodiments, the foregoing drawings and descriptions thereof depict only typical and non-limiting examples of embodiments of the subject matter and are not therefore to be considered to be limiting of its scope, it is evident that many alternatives and variations will be apparent to those skilled in the art. As will be appreciated by those skilled in the art, the example form of system 10 as a synchronous buck power supply system are used as a vehicle to explain the operation method and apparatus for forming multi-level drive signals to control transistors 35 and 36. The hereinbefore driver circuits are applicable to many different systems that control eHEMTs and are not limited to operation I a synchronous buck power supply system.

As the claims hereinafter reflect, inventive aspects may lie in less than all features of a single foregoing disclosed embodiment. Thus, the hereinafter expressed claims are hereby expressly incorporated into this Detailed Description of the Drawings, with each claim standing on its own as a separate embodiment of an invention. Furthermore, while some embodiments described herein include some but not other features included in other embodiments, combinations of features of different embodiments are meant to be within the scope of the invention, and form different embodiments, as would be understood by those skilled in the art.

The invention claimed is:

1. A method of controlling a gallium nitride switch comprising:
    configuring a first driver circuit to form a first Vgs for a first GaN switch, and configuring a second driver circuit to form a second Vgs for a second GaN switch wherein the first GaN switch and the second GaN switch are configured for coupling together at a bridge node and wherein the first driver circuit and the second driver circuit are configured receive an operating voltage between a voltage input and a common return;
    configuring the first driver circuit to enable the first GaN switch by forming the first Vgs as a first value greater than substantially the operating voltage for a first time interval wherein the first value is substantially constant for the first time interval, the first driver circuit configured to continue enabling the first GaN switch subsequently for a second time interval by forming the first Vgs as a second value that is less than the first value and greater than a first threshold value of the first GaN switch; and
    configuring the second driver circuit to enable the second GaN switch by forming the second Vgs as a third value greater than substantially the operating voltage for a third time interval wherein the third value is substantially constant for the third time interval, the second driver circuit configured to continue enabling the second GaN switch subsequently for a fourth time interval by forming the second Vgs as a fourth value that is less than the third value and greater than a second threshold value of the second GaN switch wherein the third time interval is subsequent to the second time interval and the fourth time interval is subsequent to the third time interval.

2. The method of claim 1 further including configuring the first driver circuit to disable the first GaN switch by forming the first Vgs as a fifth value that is a negative value for a fifth time interval wherein the fifth time interval is after the second time interval and is prior to the third time interval, and wherein the fifth value is substantially constant for the fifth time interval.

3. The method of claim 1 further including configuring the first driver circuit to form the first Vgs as a sixth value that is negative for a sixth time interval wherein the sixth time interval overlaps at least a portion of the third time interval.

4. The method of claim 3 further including configuring the second driver circuit to disable the second GaN switch by forming the second Vgs as sixth value that is negative for a sixth time interval wherein the sixth time interval is after the fourth time interval, and wherein the sixth value is substantially constant for the sixth time interval.

5. The method of claim 4 further including configuring the first driver circuit to form the first Vgs as a seventh value that is negative for a seventh time interval wherein the seventh time interval overlaps at least a portion of the sixth time interval.

6. The method of claim 1 further including configuring the first driver circuit to include a main driver circuit configured to couple a gate of the first GaN switch to receive the operating voltage for the second time interval.

7. The method of claim 6 further including configuring the first driver circuit to include a negative pulse circuit configured to couple a source of the first GaN switch to the common return for the second time interval.

8. The method of claim 6 further including configuring the main driver circuit to couple the gate of the first GaN switch to the common return voltage for a fifth time interval that is after the second time interval and prior to the third time interval.

9. The method of claim 8 further including configuring the first driver circuit to include a negative pulse circuit configured to couple a source of the first GaN switch to a voltage greater than the common return voltage for the fifth time interval.

10. A circuit for controlling GaN transistors comprising:
    a first circuit configured to control a first Vgs for a first GaN transistor that is coupled to a second GaN transistor wherein the first circuit is configured to form the first Vgs as a first negative value wherein the first circuit forms the first negative value for a first time interval;
    a second circuit configured to control a second Vgs for the second GaN transistor wherein the second circuit is configured to form the second Vgs as a second value for a second time interval to enable the second GaN transistor and wherein the second time interval is subsequent to the first time interval;

the first circuit configured to form the first Vgs as the first negative value for a third time interval that overlaps at least a portion of the second time interval;

the second circuit configured to form the second Vgs as a third value that is a second negative value for a fourth time interval to disable the second GaN transistor wherein the fourth time interval is subsequent to the third time interval; and the first circuit configured to form the first Vgs as the first negative value for a fifth time interval that overlaps at least a portion of the fourth time interval.

11. The circuit of claim 10 wherein the first circuit forms the third time interval no later than the second circuit forms the second time interval.

12. The circuit of claim 10 wherein the first circuit forms the third time interval after the second circuit forms the second time interval.

13. The circuit of claim 10 wherein the first circuit forms the third time interval to have a duration that is less than the second time interval.

14. The circuit of claim 10 wherein the first circuit forms the fifth time interval no later than the second circuit forms the fourth time interval.

15. The circuit of claim 10 wherein the first circuit forms the fifth time interval after the second circuit forms the fourth time interval.

16. The circuit of claim 10 wherein the first circuit forms the fifth time interval to have a duration that is less than the fourth time interval.

17. A method of forming a semiconductor device comprising:

forming a first circuit to control a first Vgs of a first HEMT, the first HEMT having a gate and a source;

forming a second circuit to control a second Vgs of a second HEMT that is coupled to the first HEMT wherein the second HEMT is coupled in series with the first HEMT at a common node; and forming the first circuit to form the first Vgs at a first negative value for at least a portion of a first time interval that the second circuit forms the second Vgs to enable the second HEMT wherein the first circuit forms the first Vgs at a value that is no less than a value of the source of the first HEMT for a second portion of the first time interval that second circuit forms the second Vgs to enable the second HEMT.

18. The method of claim 17 further including forming the first circuit to form the first Vgs at the first negative value for at least a portion of a second time interval that the second circuit disables the second HEMT.

19. The method of claim 17 further including forming the second circuit to form the second Vgs of the second HEMT at a second value for the first time interval wherein the second value is positive.

20. The method of claim 19 further including forming the second circuit to form the second Vgs of the second HEMT at the second value for the first time interval.

* * * * *